United States Patent
Nakaie et al.

(10) Patent No.: US 10,069,075 B2
(45) Date of Patent: Sep. 4, 2018

(54) CHARGE-TRANSPORTING VARNISH

(71) Applicant: NISSAN CHEMICAL INDUSTRIES, LTD., Tokyo (JP)

(72) Inventors: Naoki Nakaie, Funabashi (JP); Yuki Takayama, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 1 day.

(21) Appl. No.: 14/770,305

(22) PCT Filed: Feb. 18, 2014

(86) PCT No.: PCT/JP2014/053687
§ 371 (c)(1),
(2) Date: Aug. 25, 2015

(87) PCT Pub. No.: WO2014/132834
PCT Pub. Date: Sep. 4, 2014

(65) Prior Publication Data
US 2016/0005975 A1 Jan. 7, 2016

(30) Foreign Application Priority Data

Feb. 26, 2013 (JP) .................. 2013-036404

(51) Int. Cl.
*H01L 51/00* (2006.01)
*H01L 51/50* (2006.01)
*H01L 51/56* (2006.01)

(52) U.S. Cl.
CPC ...... *H01L 51/0059* (2013.01); *H01L 51/0067* (2013.01); *H01L 51/5056* (2013.01);
(Continued)

(58) Field of Classification Search
CPC ............. H01L 51/0059; H01L 51/0067; H01L 51/5056; H01L 51/5088; H01L 51/56; H01L 2251/303; H01L 2251/556
(Continued)

(56) References Cited

U.S. PATENT DOCUMENTS

2011/0220853 A1* 9/2011 Yoshimoto ............. C09K 11/06 252/519.3
2014/0227815 A1    8/2014 Nakaie et al.

FOREIGN PATENT DOCUMENTS

EP    2 445 027 A1    4/2012
EP    2 461 388 A1    6/2012
(Continued)

OTHER PUBLICATIONS

International Search Report, issued in PCT/JP2014/053687, dated May 20, 2014.

Kwak et al. "Hole transport materials with high glass transition temperatures for highly stable organic light-emitting diodes", Thin Solid Films, 2012, vol. 520, No. 24, pp. 7157-7163.
Written Opinion of the International Searching Authority, issued in PCT/JP2014/053687, dated May 20, 2014.
Extended European Search Report dated Jul. 12, 2016, in European Patent Application No. 14756816.6.

*Primary Examiner* — Harold Pyon
*Assistant Examiner* — Danny N Kang
(74) *Attorney, Agent, or Firm* — Birch, Stewart, Kolasch & Birch, LLP

(57) ABSTRACT

A charge-transporting varnish including charge-transporting material comprising N,N'-diaryl benzidine derivatives represented by formula (1), a charge-accepting dopant comprising heteropoly acid, and an organic solvent.

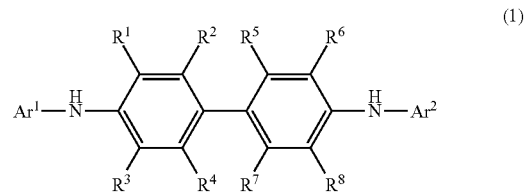

(1)

[In the formula, $R^1$ to $R^8$ independently represent hydrogen, a halogen, an alkyl having 1 to 20 carbon atoms, an alkenyl having 2 to 20 carbon atoms or an alkynyl having 2 to 20 carbon atoms; and $Ar^1$ and $Ar^2$ independently represent groups represented by formulas (2) or (3).

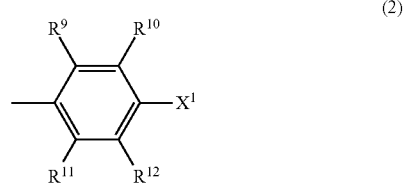

(2)

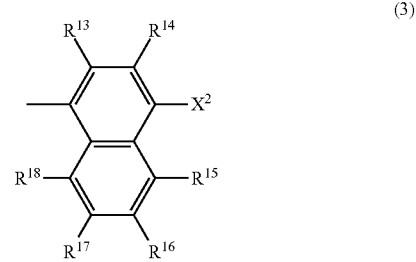

(3)

(In the formula, $R^9$ to $R^{18}$ independently represent hydrogen, a halogen, an alkyl having 1 to 20 carbon atoms, an alkenyl having 2 to 20 carbon atoms or an alkynyl having 2 to 20 carbon atoms; and $X^1$ and $X^2$ independently represent hydrogen, a halogen, an alkyl having 1 to 20 carbon atoms, an alkenyl having 2 to 20 carbon atoms, an alkynyl having 2 to 20 carbon atoms, diphenylamino, 1-naphthylphenylamino, 2-naphthylphenylamino, di(1-naphthyl)-amino, and di(2-naphthyl)-amino or 1-naphthyl-2-naphtylamino.)]

8 Claims, 1 Drawing Sheet

(52) U.S. Cl.
CPC .......... *H01L 51/5088* (2013.01); *H01L 51/56* (2013.01); *H01L 2251/303* (2013.01); *H01L 2251/556* (2013.01)

(58) Field of Classification Search
USPC ........................................................ 252/500
See application file for complete search history.

(56) References Cited

FOREIGN PATENT DOCUMENTS

| | | | |
|---|---|---|---|
| JP | 10-88123 A | | 4/1998 |
| JP | 2010225950 A | * | 10/2010 |
| WO | WO 2010/058776 A1 | | 5/2010 |
| WO | WO 2010/058777 A1 | | 5/2010 |
| WO | WO 2013/042623 A1 | | 3/2013 |

* cited by examiner

CHARGE-TRANSPORTING VARNISH

TECHNICAL FIELD

The present invention relates to a charge-transporting varnish.

BACKGROUND ART

Charge-transporting thin-films composed of organic compounds are used as the emissive layer or charge injection layer in organic electroluminescence (organic EL) devices. Processes for forming such thin-films are broadly divided into dry processes such as vapor deposition and wet processes such as spin coating. In comparing dry processes and wet processes, wet processes are capable of efficiently producing thin-films having a high flatness over a large surface area. Therefore, in the organic EL field where thin-films of larger surface area are desired, organic thin-films are often formed by wet processes.

In recent years, there has been a steadily growing desire for higher functionality, greater multifunctionality, smaller size, etc. in manufactured products within the organic EL field. Under such circumstances, to achieve, for example, lighter weights and thinner dimensions, substrates composed of organic compounds have come to be used in place of glass substrates, and so the treatment temperatures that can be used in manufacturing processes have become lower than in the past. As a result, there exists today in the organic EL field an increasing desire for varnishes which can be baked at lower temperatures and which, moreover, even in such cases, provide thin-films endowed with good charge transportability.

PRIOR ART DOCUMENTS

Patent Documents

Patent Document 1: WO 2010/058777
Patent Document 2: JP-A H10-088123

SUMMARY OF THE INVENTION

Problems to be Solved by the Invention

It is therefore an object of the present invention to provide a charge-transporting varnish which can be baked not only at elevated temperatures of 200° C. and above but also at low temperatures below 200° C. and which forms a thin-film produced under such baking conditions that has a high flatness and a high charge transportability and that, when employed in organic EL devices, gives a charge-transporting thin-film capable of eliciting excellent EL device characteristics.

Means for Solving the Problems

The inventors have conducted extensive investigations, as a result of which they have discovered that, by using a varnish containing a charge-transporting material composed of an N,N'-diarylbenzidine derivative, a charge-accepting dopant composed of a heteropolyacid, and an organic solvent, a thin-film having a high flatness and a high charge transportability can be obtained not only when baked at elevated temperatures of 200° C. and above but even when baked at low temperatures below 200° C., and that when such a thin-film is employed as a hole injection layer, an organic EL device capable of exhibiting excellent brightness characteristics can be obtained. Although Patent Document 2 discloses an organic EL device in which N,N'-diphenyl-benzidine is used as a hole-transporting material, nothing whatsoever is disclosed concerning the fact that, by combining this compound with a heteropolyacid, there can be obtained a varnish that can be baked not only at elevated temperatures of 200° C. and above but even at low temperatures below 200° C. and that can give a thin-film having a high flatness and high charge transportability.

Accordingly, the invention provides the following charge-transporting varnish.

1. A charge-transporting varnish including a charge-transporting material composed of an N,N'-diarylbenzidine derivative of formula (1), a charge-accepting dopant composed of a heteropolyacid, and an organic solvent:

[Chemical Formula 1]

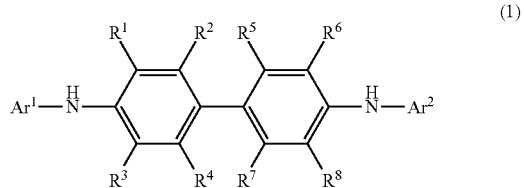

wherein $R^1$ to $R^8$ are each independently a hydrogen atom, a halogen atom, an alkyl group of 1 to 20 carbons, an alkenyl group of 2 to 20 carbons or an alkynyl group of 2 to 20 carbons; and $Ar^1$ and $Ar^2$ are each independently a group of formula (2) or (3):

[Chemical Formula 2]

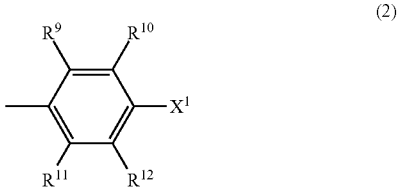

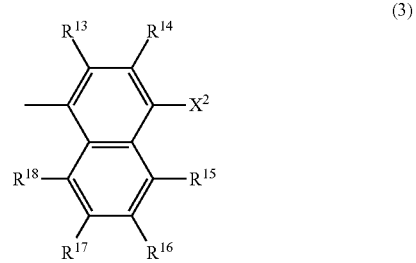

wherein $R^9$ to $R^{18}$ are each independently a hydrogen atom, a halogen atom, an alkyl group of 1 to 20 carbons, an alkenyl group of 2 to 20 carbons or an alkynyl group of 2 to 20 carbons; and $X^1$ and $X^2$ are each independently a hydrogen atom, a halogen atom, an alkyl group of 1 to 20 carbons, an alkenyl group of 2 to 20 carbons, an alkynyl group of 1 to 20 carbons, a diphenylamino group, a 1-naphthylphenylamino group, a 2-naphthylphenylamino group, a di(1-naphthyl)amino group, a di(2-naphthyl)amino group or a 1-naphthyl-2-naphthylamino group.

2. The charge-transporting varnish according to 1 above, wherein $R^1$ to $R^8$ are hydrogen atoms, fluorine atoms or alkyl groups of 1 to 20 carbons.

3. The charge-transporting varnish according to 1 or 2 above, wherein $R^9$ to $R^{18}$ are hydrogen atoms, fluorine atoms or alkyl groups of 1 to 20 carbons.
4. A charge-transporting thin-film produced using the charge-transporting varnish of any one of 1 to 3 above.
5. An electronic device having the charge-transporting thin-film of 4 above.
6. An organic EL device having the charge-transporting thin-film of 4 above.
7. The organic EL device according to 6 above, wherein the charge-transporting thin-film is a hole injection layer or a hole transport layer.
8. A method of producing a charge-transporting thin film, including coating the charge-transporting varnish of any one of 1 to 3 above onto a substrate, and baking at 140° C. to 250° C.
9. A method of producing an organic EL device using the charge-transporting thin-film of 4 above.
10. A method of producing an organic EL device using a charge-transporting thin-film obtained by the production method of 8 above.

Advantageous Effects of the Invention

The charge-transporting varnish of the invention, because it includes an N,N'-diarylbenzidine derivative and a heteropolyacid, can be baked not only at elevated temperatures of 200° C. and above, but even at temperatures below 200° C., especially at low temperatures of from about 140 to about 200° C. Moreover, a thin-film produced under such baking conditions has a high flatness and a high charge transportability; when such a thin-film is employed as a hole injection layer, an organic EL device capable of exhibiting excellent brightness characteristics can be obtained. Hence, by using the charge-transporting varnish of this invention, it is possible to achieve higher efficiency and higher yield in device production owing in part to the milder production conditions, and to render such devices more lightweight and compact.

Also, the charge-transporting varnish of the invention can reproducibly produce thin-films of excellent charge transportability even using various wet processes capable of film formation over a large surface area, such as spin coating or slit coating, and is thus capable of fully accommodating recent advances in the field of organic EL devices.

In addition, thin-films obtained from the charge-transporting varnish of the invention can also be used as, for example, antistatic coatings or as anode buffer layers in organic thin-film solar cells.

EMBODIMENT FOR CARRYING OUT THE INVENTION

[Charge-Transporting Material]

Figure 1A:
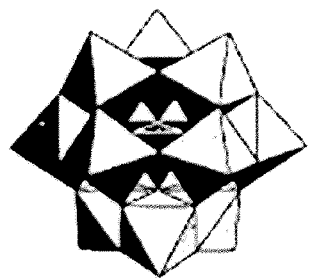
FIG. 1(A) illustrates the formula of a polyacid having a Keggin-type chemical structure in which a heteroatom is positioned at the center of the molecule.

The charge-transporting varnish of the invention includes a charge-transporting material composed of an N,N'-diarylbenzidine derivative of formula (1). Here, "charge-transporting" is synonymous with electrically conductive, and means the same thing as hole-transporting. The charge-transporting varnish of the invention may itself have charge transportability, or a solid film obtained using the varnish may have charge transportability.

[Chemical Formula 3]

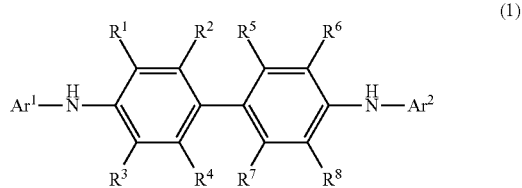

(1)

In formula (1), $R^1$ to $R^8$ are each independently a hydrogen atom, a halogen atom, an alkyl group of 1 to 20 carbons, an alkenyl group of 2 to 20 carbons or an alkynyl group of 2 to 20 carbons.

Illustrative examples of the halogen atom include fluorine, chlorine, bromine and iodine atoms.

The alkyl group of 1 to 20 carbons may be linear, branched or cyclic. Illustrative examples include linear or branched alkyl groups of 1 to 20 carbons such as methyl, ethyl, n-propyl, isopropyl, n-butyl, isobutyl, s-butyl, t-butyl, n-pentyl, n-hexyl, n-heptyl, n-octyl, n-nonyl and n-decyl groups; and cyclic alkyl groups of 3 to 20 carbons such as cyclopropyl, cyclobutyl, cyclopentyl, cyclohexyl, cycloheptyl, cyclooctyl, cyclononyl, cyclodecyl, bicyclobutyl, bicyclopentyl, bicyclohexyl, bicycloheptyl, bicyclooctyl, bicyclononyl and bicyclodecyl groups.

Illustrative examples of alkenyl groups of 2 to 20 carbons include ethenyl, n-1-propenyl, n-2-propenyl, 1-methylethenyl, n-1-butenyl, n-2-butenyl, n-3-butenyl, 2-methyl-1-propenyl, 2-methyl-2-propenyl, 1-ethylethenyl, 1-methyl-1-propenyl, 1-methyl-2-propenyl, n-1-pentenyl, n-1-decenyl and n-1-eicosenyl groups.

Illustrative examples of alkynyl groups of 2 to 20 carbons include ethynyl, n-1-propynyl, n-2-propynyl, n-1-butynyl, n-2-butynyl, n-3-butynyl, 1-methyl-2-propynyl, n-1-pentynyl, n-2-pentynyl, n-3-pentynyl, n-4-pentynyl, 1-methyl-n-butynyl, 2-methyl-n-butynyl, 3-methyl-n-butynyl, 1,1-dimethyl-n-propynyl, n-1-hexynyl, n-1-decynyl, n-1-pentadecynyl and n-1-eicosynyl groups.

Of these, $R^1$ to $R^8$ are preferably hydrogen atoms, fluorine atoms or alkyl groups of 1 to 20 carbons, more preferably hydrogen atoms or fluorine atoms, and most preferably all hydrogen atoms.

In formula (1), $Ar^1$ and $Ar^2$ are each independently a group of formula (2) or (3).

[Chemical Formula 4]

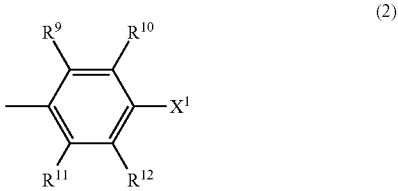

(2)

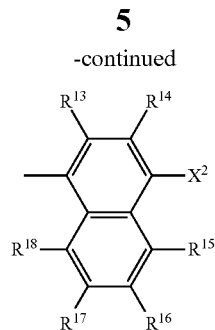

(3)

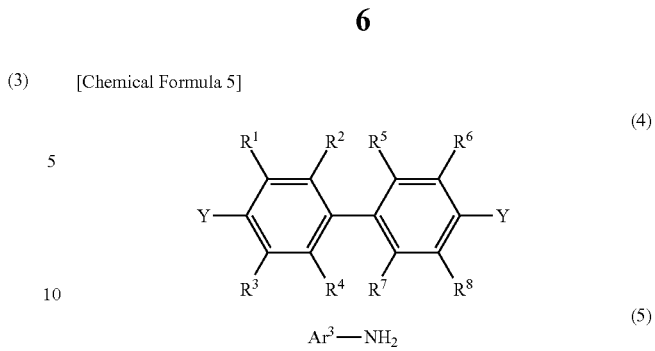

In formulas (2) and (3), $R^9$ to $R^{18}$ are each independently a hydrogen atom, a halogen atom, an alkyl group of 1 to 20 carbons, an alkenyl group of 2 to 20 carbons or an alkynyl group of 2 to 20 carbons. Of these, $R^9$ to $R^{18}$ are preferably hydrogen atoms, fluorine atoms or alkyl groups of 1 to 20 carbons, more preferably hydrogen atoms or fluorine atoms, and most preferably all hydrogen atoms.

$X^1$ and $X^2$ are each independently a hydrogen atom, a halogen atom, an alkyl group of 1 to 20 carbons, an alkenyl group of 2 to 20 carbons, an alkynyl group of 2 to 20 carbons, a diphenylamino group, a 1-naphthylphenylamino group, a 2-naphthylphenylamino group, a di(1-naphthyl)amino group, a di(2-naphthyl)amino group or a 1-naphthyl-2-naphthylamino group. Of these, $X^1$ and $X^2$ are preferably hydrogen atoms, fluorine atoms, alkyl groups of 1 to 20 carbons, diphenylamino groups, 1-naphthylphenylamino groups, 2-naphthylphenylamino groups, di(1-naphthyl)amino groups, di(2-naphthyl)amino groups or 1-naphthyl-2-naphthylamino groups; more preferably hydrogen atoms, diphenylamino groups, 1-naphthylphenylamino groups, 2-naphthylphenylamino groups, di(1-naphthyl)amino groups, di(2-naphthyl)amino groups or 1-naphthyl-2-naphthylamino groups; and even more preferably hydrogen atoms or diphenylamino groups.

The halogen atoms, alkyl groups, alkenyl groups and alkynyl groups represented by $R^9$ to $R^{18}$ and $X^1$ and $X^2$ are exemplified by the same groups as mentioned above.

The molecular weight of the N,N'-diarylbenzidine derivative used in the invention is generally from 200 to 5,000. However, from the standpoint of increasing the solubility, this is preferably not more than 3,000, and more preferably not more than 2,000.

In this invention, the N,N'-diarylbenzidine derivative used may be a commercial product or may be one synthesized by a known method (e.g., the method described in *Thin Solid Films*, 520 (24), pp. 7157-7163 (2012)) or by the subsequently described method. In all of these cases, it is preferable to use a N,N'-diarylbenzidine derivative that has been purified by recrystallization, vapor deposition or the like before preparing the charge-transporting varnish. By using a purified N,N'-diarylbenzidine derivative, the characteristics of organic EL devices provided with a thin-film obtained from the varnish can be further increased. When purifying by recrystallization, 1,4-dioxane, tetrahydrofuran or the like may be used as the solvent.

The N,N'-diarylbenzidine derivative of formula (1) can be obtained by, for example, reacting a biphenyl compound of formula (4) with an aromatic amine compound of formula (5).

In the formula, $R^1$ to $R^8$ are the same as above; $Ar^3$ is the same as $Ar^1$ and $Ar^2$ above; and Y is a halogen atom such as a chlorine, bromine or iodine atom.

Examples of the biphenyl compound of formula (4) include 4,4'-dichlorobiphenyl, 4,4'-dibromobiphenyl, 4,4'-diiodobiphenyl, 4-chloro-4'-bromobiphenyl, 4-chloro-4'-iodobiphenyl and 4-bromo-4'-iodobiphenyl.

Examples of aromatic amine compounds of formula (5) include aniline, 1-naphthylamine, 4-(diphenylamino)aniline and 4-diphenylamino-1-naphthylamine.

The relative proportions in which the biphenyl compound of formula (4) and the aromatic amine compound of formula (5) are charged may be set to from about 1.8 to about 4.0 moles, and preferably from about 2.0 to about 3.0 moles, of the aromatic amine compound per mole of the biphenyl compound.

Catalysts that may be used in the above reaction are exemplified by copper catalysts such as copper chloride, copper bromide and copper iodide; and palladium catalysts such as $Pd(PPh_3)_4$ (tetrakis(triphenylphosphine)palladium), $Pd(PPh_3)_2Cl_2$ (bis(triphenylphosphine)dichloropalladium), $Pd(dba)_2$ (bis(benzylideneacetone)palladium), $Pd_2(dba)_3$ (tris(benzylideneacetone)dipalladium) and $Pd(P-t-Bu_3)_2$ (bis(tri(t-butylphosphine)palladium)).

These catalysts may be used singly or two or more may be used in combination. Also, these catalysts may be used together with suitable ligands.

The amount of catalyst used may be set to about 0.001 to 0.5 mole per mole of the biphenyl compound, and is preferably from about 0.01 to about 0.2 mole.

The reaction may be carried out in a solvent. When use is made of a solvent, any solvent may be used provided it does not have an adverse effect on the reaction. Illustrative examples of the solvent include aliphatic hydrocarbons (e.g., pentane, n-hexane, n-octane, n-decane, decalin), halogenated aliphatic hydrocarbons (e.g., chloroform, dichloromethane, dichloroethane, carbon tetrachloride), aromatic hydrocarbons (e.g., benzene, nitrobenzene, toluene, o-xylene, m-xylene, p-xylene, mesitylene), halogenated aromatic hydrocarbons (e.g., chlorobenzene, bromobenzene, o-dichlorobenzene, m-dichlorobenzene, p-dichlorobenzene), ethers (e.g., diethyl ether, diisopropyl ether, t-butyl methyl ether, tetrahydrofuran, dioxane, 1,2-dimethoxyethane, 1,2-diethoxyethane), ketones (e.g., acetone, methyl ethyl ketone, methyl isobutyl ketone, di-n-butyl ketone, cyclohexanone), amides (e.g., N,N-dimethylformamide, N,N-dimethylacetamide), lactams and lactones (e.g., N-methylpyrrolidone, γ-butyrolactone), ureas (e.g., N,N-dimethylimidazolidinone, tetramethylurea), sulfoxides (e.g., dimethylsulfoxide, sulfolane), and nitriles (e.g., acetonitrile, propionitrile, butyronitrile). These solvents may be used singly or two or more may be used in admixture.

The reaction temperature may be suitably selected in the range of from the melting point to the boiling point of the solvent used, although the temperature is preferably from about 0° C. to about 200° C., and more preferably from 20 to 150° C.

Following reaction completion, the target N,N'-diarylbenzidine derivative can be obtained by work-up in the usual manner.

In this invention, especially preferred examples of the N,N'-diarylbenzidine derivative include, but are not limited to, the following.

[Chemical Formula 6]

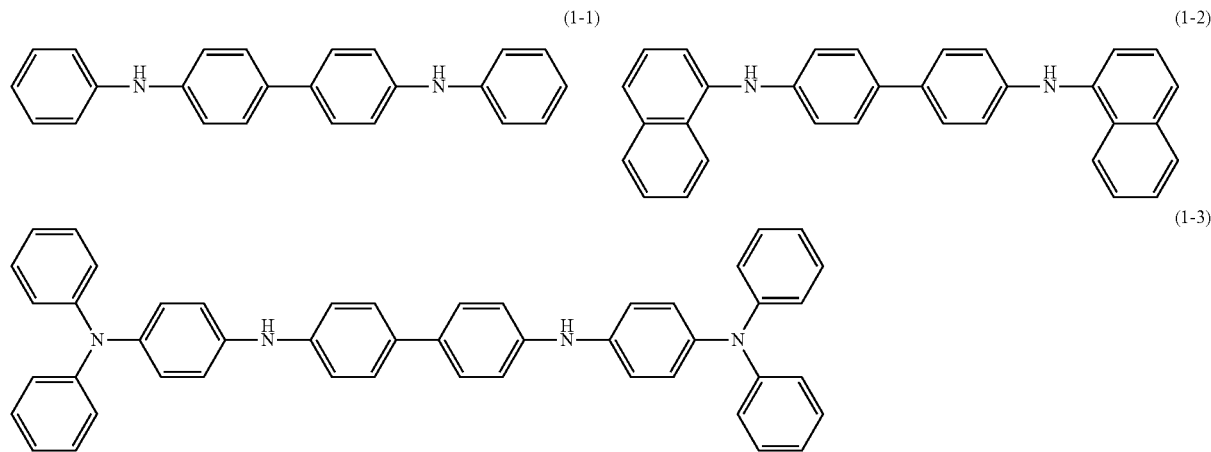

unity (1) for the charge-transporting material of from about 1.0 to about 11.0, preferably from about 2.5 to about 9.0, and more preferably from about 3.0 to about 7.0, a charge-transporting thin-film that imparts a high brightness when used in organic EL devices can be reproducibly obtained. That is, the ratio of the heteropolyacid weight ($W_D$) to the N,N'-diarylbenzidine derivative weight ($W_H$) in the charge-transporting varnish of the invention typically satisfies the relationship $1.0 \leq W_D/W_H \leq 11.0$, preferably satisfies the relationship $2.5 \leq W_D/W_H \leq 9.0$, and more preferably satisfies the relationship $3.0 \leq W_D/W_H \leq 7.0$.

[Charge-Accepting Dopant]

Figure 1B:
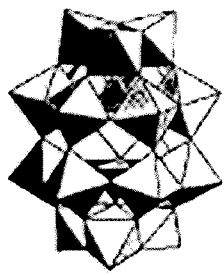
FIG. 1(B) illustrates the formula of a polyacid having a Dawson-type chemical structure in which a heteroatom is positioned at the center of the molecule.

The charge-transporting varnish of the invention includes a charge-accepting dopant composed of a heteropolyacid. "Heteropolyacid" refers to a polyacid having a structure in which a heteroatom is positioned at the center of the molecule—typically of the Keggin-type chemical structure shown in the formula of FIG. 1(A) or the Dawson-type chemical structure shown in the formula of FIG. 1(B), and which is obtained by the condensation of an isopolyacid which is an oxo acid of vanadium (V), molybdenum (Mo), tungsten (W) or the like with an oxo acid of a different element. Examples of this oxo acid of another element include primarily oxo acids of silicon (Si), phosphorus (P) and arsenic (As).

Heteropolyacids are available as commercial products. Alternatively, the heteropolyacid may be synthesized by a known method.

Illustrative examples of heteropolyacids include phosphomolybdic acid, silicomolybdic acid, phosphotungstic acid and silicotungstic acid. The heteropolyacid may be of one type used alone or may be of two or more types used in combination.

Particularly in cases where the charge-accepting dopant is composed of a single heteropolyacid by itself, this one heteropolyacid is preferably phosphotungstic acid or phosphomolybdic acid, and is most preferably phosphotungstic acid.

Even in cases where the charge-accepting dopant is composed of two or more heteropolyacids, at least one of the two or more heteropolyacids is preferably phosphotungstic acid or phosphomolybdic acid, and is most preferably phosphotungstic acid.

In this invention, by setting the heteropolyacid, and preferably phosphotungstic acid, to a mass ratio relative to In addition to the above N,N'-diarylbenzidine derivatives and heteropolyacids, the charge-transporting varnish of the invention may also use other known charge-transporting materials and charge-accepting dopants.

[Organic Solvent]

The organic solvent used when preparing the charge-transporting varnish of the invention may be a high-solvency solvent which is able to dissolve well the charge-transporting material and the charge-accepting dopant. Examples of such high-solvency solvents include N,N-dimethylformamide, N,N-dimethylacetamide, N-methylpyrrolidone, 1,3-dimethyl-2-imidazolidinone and diethylene glycol monomethyl ether. These solvents may be used singly, or two or more may be used in admixture. The amount of use may be set to from 5 to 100 wt %, based on the overall solvent used in the varnish. It is preferable for the charge-transporting material and the charge-accepting dopant to each be either completely dissolved or in a uniformly dispersed state within the solvent.

In addition, at least one high-viscosity organic solvent having a viscosity at 25° C. of from 10 to 200 mPa·s, and especially 35 to 150 mPa·s, and having a boiling point at standard pressure (atmospheric pressure) of from 50 to 300° C., and especially from 150 to 250° C., may be included in the charge-transporting varnish of the invention. By doing so, adjusting the viscosity of the varnish is easy, as a result of which the preparation of a varnish that reproducibly gives thin-films of high flatness and accords with the coating method to be used is possible.

Illustrative examples of high-viscosity organic solvents include, but are not limited to, cyclohexanol, ethylene glycol, ethylene glycol diglycidyl ether, 1,3-octylene glycol, diethylene glycol, dipropylene glycol, triethylene glycol, tripropylene glycol, 1,3-butanediol, 2,3-butanediol, 1,4-butanediol, propylene glycol and hexylene glycol. These solvents may be used singly, or two or more may be used in admixture.

The amount of high-viscosity organic solvent added as a proportion of the overall solvent used in the varnish of the invention is preferably within a range where no precipitation of solids occurs. To the extent that solids do not precipitate, the amount of such addition is preferably from 5 to 80 wt %.

In addition, other solvents may be admixed in a proportion with respect to the overall solvent used in the varnish of from 1 to 90 wt %, and preferably from 1 to 50 wt %, for such purposes as to enhance the substrate wettability, adjust the solvent surface tension, adjust the solvent polarity and adjust the solvent boiling point.

Examples of such solvents include, but are not limited to, ethylene glycol monobutyl ether, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether, propylene glycol monomethyl ether acetate, diethylene glycol monoethyl ether, diacetone alcohol, γ-butyrolactone, ethyl lactate and n-hexyl acetate. These solvents may be used singly, or two or more may be used in admixture.

The viscosity of the inventive varnish is suitably set according to such factors as the thickness of the thin-film to be produced and the solids concentration of the varnish, but is generally from 1 to 50 mPa·s at 25° C.

The solids concentration of the charge-transporting varnish of this invention is suitably set while taking into consideration the viscosity, surface tension and other properties of the varnish and the thickness and other properties of the thin-film to be produced, and is generally from about 0.1 wt % to about 10.0 wt %. From the standpoint of improving the coating properties of the varnish, the solids concentration of the varnish is preferably from 0.5 to 5.0 wt %, and more preferably from 1.0 to 3.0 wt %.

[Charge-Transporting Thin-Film]

By coating the charge-transporting varnish of the invention onto a substrate and baking, a charge-transporting thin-film can be formed on the substrate.

Examples of the varnish coating method include, but are not particularly limited to, dipping, spin coating, transfer printing, roll coating, brush coating, inkjet printing and spraying. It is preferable to adjust the viscosity and surface tension of the varnish according to the coating method to be used.

When using the varnish of the invention, the baking atmosphere is not particularly limited. A thin-film having a uniform film surface and high charge transportability can be obtained not only in an open-air atmosphere, but even in an inert gas such as nitrogen or in a vacuum.

The baking temperature is suitably set in a range of generally from 100 to 260° C. while taking into consideration such factors as the intended use of the resulting thin-film and the degree of charge transportability to be imparted to the resulting thin-film. In cases where the resulting thin-film is to be used as a hole transport layer in an organic EL device, the baking temperature is preferably from about 140 to about 250° C., and more preferably from about 145 to about 240° C. During baking, a temperature change in two or more steps may be applied for such purposes as to manifest a more uniform film formability or to induce the reaction to proceed on the substrate. Heating may be carried out using a suitable apparatus such as a hot plate or an oven.

The thickness of the charge-transporting thin-film is not particularly limited; when used as a hole injection layer in an organic EL device, a film thickness of from 5 to 200 nm is preferred. Methods of varying the film thickness include, for example, varying the solids concentration in the varnish and varying the amount of solution on the substrate during coating.

[Organic EL Device]

Examples of the materials and method used to fabricate organic light-emitting diode (OLED) devices using the charge-transporting varnish of the invention include, but are not limited to, those mentioned below.

The electrode substrate to be used is preferably cleaned by carrying out liquid washing beforehand with a cleaning agent, alcohol, pure water or the like. For example, in the case of a positive electrode substrate, it is preferable to carry out surface treatment such as UV/ozone treatment or oxygen-plasma treatment just prior to use. However, in cases where the positive electrode material is composed primarily of organic substances, surface treatment need not be carried out.

An example of a method of manufacturing an OLED device having a hole injection layer composed of a thin-film obtained from the charge-transporting varnish of the invention is described below.

Using the above methods, a hole injection layer is formed on an electrode by coating the charge-transporting varnish of the invention onto a positive electrode substrate and baking. The hole injection layer is then introduced into a vacuum deposition system, where a hole transport layer, emissive layer, electron transport layer, electron injection layer and negative electrode metal are vapor-deposited in this order to form the OLED device. Carrier block layers may be provided to desired layer intervals so as to control the light-emitting region.

Illustrative examples of the positive electrode material include transparent electrodes such as indium-tin oxide (ITO) and indium-zinc oxide (IZO). A positive electrode material on which planarizing treatment has been carried out is preferred. Use can also be made of polythiophene derivatives and polyaniline derivatives having a high charge transportability.

Illustrative examples of the hole transport layer-forming material include triarylamines such as (triphenylamine)dimer (TPD) derivatives, N,N'-di(1-naphthyl)-N,N'-diphenylbenzidine (α-NPD) and [(triphenylamine)dimer] spirodimer (Spiro-TAD); starburst amines such as 4,4',4"-tris[3-methylphenyl(phenyl)amino]triphenylamine (m-MTDATA) and 4,4',4"-tris[1-naphthyl(phenyl)amino]triphenylamine (1-TNATA); and oligothiophenes such as 5,5"-bis-{4-[bis (4-methylphenyl)amino]phenyl}-2,2':5',2"-terthiophene (BMA-3T).

Illustrative examples of the emissive layer-forming material include tris(8-quinolinolate)aluminum(III) (Alq$_3$), bis(8-quinolinolate)zinc(II) (Znq$_2$), bis(2-methyl-8-quinolinolate)(p-phenylphenolate)aluminum(III) (BAlq) and 4,4'-bis(2,2-diphenylvinyl)biphenyl (DPVBi). It is also possible to form the emissive layer by the co-vapor deposition of an electron-transporting material or hole-transporting material with a light-emitting dopant.

Illustrative examples of the electron-transporting material include Alq$_3$, BAlq, DPVBi, 2-(4-biphenyl)-5-(4-t-butylphenyl)-1,3,4-oxadiazole (PBD), triazole derivatives (TAZ), bathocuproin (BCP) and silole derivatives.

Illustrative examples of light-emitting dopants include quinacridone, rubrene, coumarin 540, 4-(dicyanomethylene)-2-methyl-6-(p-dimethylaminostyryl)-4H-pyran (DCM), tris(2-phenylpyridine) iridium(III) (Ir(ppy)$_3$) and (1,10-phenanthroline)-tris(4,4,4-trifluoro-1-(2-thienyl)-butane-1,3-dionate) europium(III) (Eu(TTA)$_3$phen).

Illustrative examples of the carrier block layer-forming material include PBD, TAZ and BCP.

Illustrative examples of the electron injection layer-forming material include lithium oxide (Li$_2$O), magnesium oxide (MgO), alumina (Al$_2$O$_3$), lithium fluoride (LiF), sodium fluoride (NaF), magnesium fluoride (MgF$_2$), strontium fluoride (SrF$_2$), Liq, Li(acac), lithium acetate and lithium benzoate.

Illustrative examples of the negative electrode material include aluminum, magnesium-silver alloys, aluminum-lithium alloys, lithium, sodium, potassium and cesium.

The method of fabricating polymer LED (PLED) devices using the charge-transporting varnish of the invention, although not particularly limited, is exemplified by the following method.

A PLED device having a charge-transporting thin-film formed using the charge-transporting varnish of the invention can be fabricated by, in the fabrication of an OLED device as described above, successively forming a hole-transporting polymer layer and a light-emitting polymer layer instead of carrying out vacuum deposition operations for a hole transport layer, emissive layer, electron transport layer and electron injection layer. Specifically, the charge-transporting varnish of the invention is coated onto a positive electrode substrate and a hole injection layer is produced by the above-described method. A hole-transporting polymer layer and a light-emitting polymer layer are successively formed on top thereof, in addition to which a negative electrode is vapor-deposited, thereby forming the PLED device.

The negative electrode and positive electrode materials used here may be similar to those used when fabricating an OLED device as described above, and similar cleaning treatment and surface treatment may be carried out.

The method of forming the hole-transporting polymer layer and the light-emitting polymer layer is exemplified by a film-forming method in which a hole-transporting polymer material or a light-emitting polymer material, or respective materials obtained by adding dopants to these, is dissolved or uniformly dispersed by the addition of a solvent, following which the resulting solution or dispersion is coated onto the hole injection layer or the hole-transporting polymer layer, and these are each subsequently baked.

Illustrative examples of the hole-transporting polymer material include
poly[(9,9-dihexylfluorenyl-2,7-diyl)-co-(N,N'-bis {p-butylphenyl}-1,4-diaminophenylene)],
poly[(9,9-dioctylfluorenyl-2,7-diyl)-co-(N,N'-bis {p-butylphenyl}-1,1'-biphenylene-4,4-diamine)],
poly[(9,9-bis {1'-penten-5'-yl}fluorenyl-2,7-diyl)-co-(N,N'-bis {p-butylphenyl}-1,4-diaminophenylene)],
poly[N,N'-bis(4-butylphenyl)-N,N'-bis(phenyl)-benzidine] end-capped with polysilsesquioxane and
poly[(9,9-dioctylfluorenyl-2,7-diyl)-co-(4,4'-(N-(p-butylphenyl))diphenylamine)].

Illustrative examples of light-emitting polymer materials include polyfluorene derivatives such as poly(9,9-dialkylfluorene) (PDAF), poly(phenylene vinylene) derivatives such as poly(2-methoxy-5-(2'-ethylhexoxy)-1,4-phenylenevinylene) (MEH-PPV), polythiophene derivatives such as poly(3-alkylthiophene) (PAT), and polyvinylcarbazole (PVCz).

Illustrative examples of the solvent include toluene, xylene and chloroform. Examples of the method of dissolution or uniform dispersion include stirring, stirring under applied heat, and ultrasonic dispersion.

Examples of the coating method include, but are not particularly limited to, inkjet printing, spraying, dipping, spin coating, transfer printing, roll coating and brush coating. Coating is preferably carried out in an inert gas atmosphere such as nitrogen or argon.

Examples of the baking method include methods that involve heating in an oven or on a hot plate and within an inert gas atmosphere or in a vacuum.

EXAMPLES

Examples and Comparative Examples are given below to more concretely illustrate the invention, although the invention is not limited by these Examples. The equipment used was as follows.
(1) $^1$H-NMR Measurement: High-resolution NMR spectrometer, from Varian, Inc.
(2) Substrate Cleaning: Substrate cleaning machine (reduced-pressure plasma system),
from Choshu Industry Co., Ltd.
(3) Varnish Coating: MS-A100 Spin Coater,
from Mikasa Co., Ltd.
(4) Film Thickness Measurement:
Microfigure measuring instrument
Surfcorder ET-4000,
from Kosaka Laboratory, Ltd.
(5) EL Device Fabrication: Multifunction Evaporation System C-E2L1G1-N,
from Choshu Industry Co., Ltd.
(6) Measurement of EL Device Brightness, etc.:
I-V-L Measurement System
from Tech World, Inc.

[1] Synthesis of Compounds

Synthesis Example 1

Synthesis of 4-(Diphenylamino)aniline

[Chemical Formula 8]

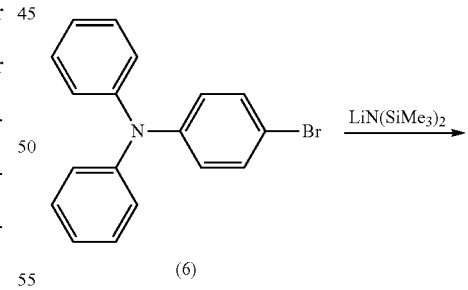

(6)

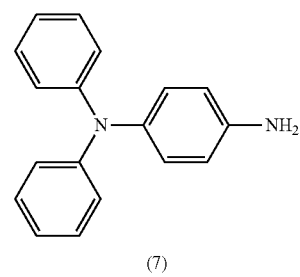

(7)

LiN(SiMe$_3$)$_2$ (33.9 mL, as a 1 mol/L toluene solution) was added dropwise to a toluene solution (77 mL) of p-bromotriphenylamine (10.0 g, 30.8 mmol) and Pd(dba)$_2$ (0.887 g, 1.54 mmol). Next, t-Bu$_3$P (0.312 g, 1.54 mmol) was added to the reaction mixture, which was then stirred at room temperature for 20 hours.

Following the completion of stirring, 1 mol/L hydrochloric acid was added, thereby acidifying the mixture and stopping the reaction. Toluene was added thereto and liquid-liquid extraction was carried out. The toluene phase was washed with a 2 mol/L aqueous sodium hydroxide solution and water in this order, after which the solvent was removed by distillation from the washed toluene phase, giving a crude product.

Finally, recrystallization was carried out using a mixed solvent of ethyl acetate and hexane, thereby giving 4-(diphenylamino)aniline in an amount of 6.16 g (yield, 77%). The $^1$H-NMR measurement results are shown below.

$^1$H-NMR (CDCl$_3$): δ 7.22-7.16 (m, 4H), 7.06-7.01 (m, 4H), 6.96 (d, J=8.8 Hz, 2H), 6.91-6.88 (m, 2H), 6.65 (d, J=8.8 Hz, 2H), 3.60 (bs, 2H, NH$_2$)

Synthesis Example 2

Synthesis of
N,N'-Bis(p-(biphenylamino)phenyl)benzidine

Finally, the resulting crude product was washed in a slurry state within a mixed solvent of tetrahydrofuran and methanol, and then filtered, giving N,N'-bis(p-(diphenyl-amino)phenyl)benzidine in an amount of 3.88 g (yield, 90%). The $^1$H-NMR measurement results are shown below.

$^1$H-NMR (CDCl$_3$): δ 7.45 (d, J=8.8 Hz, 4H), 7.23 (dd, J=7.6, 8.8 Hz, 8H), 7.13-7.08 (m, 2011), 6.96 (t, J=7.6 Hz, 411), 5.67 (s, 2H, NH)

[2] Preparation of Charge-Transporting Varnish

Example 1-1

N,N'-Diphenylbenzidine (0.148 g, Tokyo Chemical Industry Co., Ltd.) and 0.594 g of phosphotungstic acid (Kanto Chemical Co.) were dissolved in 8.0 g of 1,3-dimethyl-2-imidazolidinone under a nitrogen atmosphere. Cyclohexanol (12.0 g) and 4.0 g of propylene glycol were added to the resulting solution and stirring was carried out, thereby preparing a charge-transporting varnish. The N,N'-diphenylbenzidine was recrystallized from 1,4-dioxane, then thoroughly dried under reduced pressure and used.

Examples 1-2 and 1-3

Aside from changing the amounts of N,N'-diphenylbenzidine and phosphotungstic acid used to, respectively, 0.124

[Chemical Formula 9]

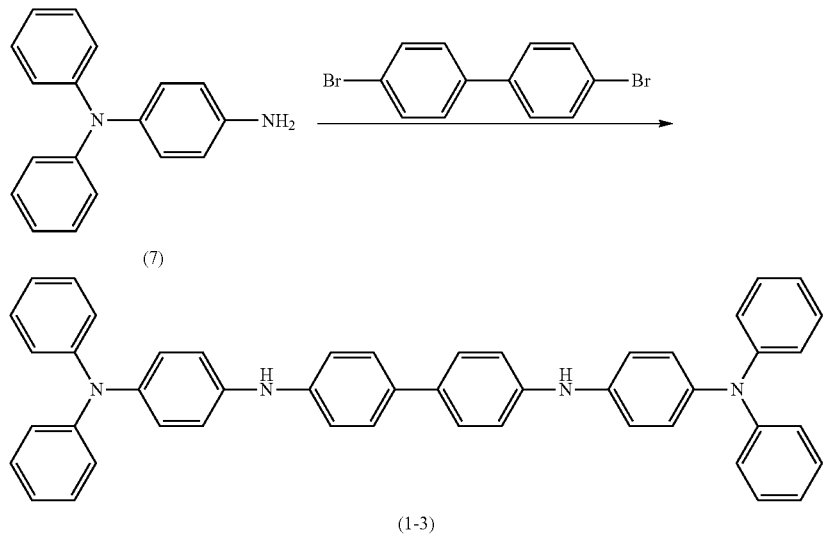

t-BuONa (1.85 g, 19.2 mmol), Pd(dba)$_2$ (0.0737 g, 0.128 mmol) and t-Bu$_3$P (0.0207 g, 0.103 mmol) were added in this order to a toluene solution (52 mL) of 4,4'-dibromobiphenyl (2.00 g, 6.41 mmol) and 4-(diphenylamino)aniline (3.50 g, 13.5 mmol), and the temperature of the mixture was raised to 70° C., after which the mixture was stirred for 20 hours.

Following the completion of stirring, water was added to the reaction mixture, thereby stopping the reaction. Ethyl acetate and hexane were added thereto, and the solid that settled out was collected by filtration. The resulting solid was dissolved in tetrahydrofuran and the insolubles were removed by filtration. The solvent was driven from the filtrate by distillation, giving a crude product.

g and 0.619 g (Example 1-2) and 0.106 g and 0.636 g (Example 1-3), a charge-transporting varnish was prepared by the same method as in Example 1-1.

Example 1-4

First, 0.082 g of the N,N'-bis(p-(diphenylamino)-phenyl)benzidine produced in Synthesis Example 2 and 0.408 g of phosphotungstic acid were dissolved in 8.0 g of 1,3-dimethyl-2-imidazolidinone under a nitrogen atmosphere. Next, 12.0 g of cyclohexanol and 4.0 g of propylene glycol were added to the resulting solution and stirring was carried out, thereby preparing a charge-transporting varnish. The N,N'- bis(p-(diphenylamino)phenyl)benzidine was used after being recrystallized from 1,4-dioxane, then thoroughly dried under reduced pressure.

Example 1-5

Aside from changing the amounts of N,N'-bis(p-diphenylamino)phenyl)benzidine and phosphotungstic acid used to, respectively, 0.070 g and 0.420 g, a charge-transporting varnish was prepared by the same method as in Example 1-4.

Comparative Example 1

An attempt was made to prepare a varnish using 0.742 g of N,N'-diphenylbenzidine, 8.0 g of 1,3-dimethyl-2-imidazolidinone, 12.0 g of cyclohexanol and 4.0 g of propylene glycol, but suspension arose in the varnish and so a uniform varnish capable of being used to form charge-transporting thin-films for organic EL devices could not be obtained.

Comparative Example 2

An attempt was made to prepare a varnish using 0.490 g of N,N'-bis(p-(diphenylamino)phenyl)benzidine, 8.0 g of 1,3-dimethyl-2-imidazolidinone, 12.0 g of cyclohexanol and 4.0 g of propylene glycol, but suspension arose in the varnish and so a uniform varnish capable of being used to form charge-transporting thin-films for organic EL devices could not be obtained.

[3] Fabrication of Organic EL Devices and Evaluation of Device Characteristics

Example 2-1

The varnish obtained in Example 1-1 was coated onto an ITO substrate using a spin coater, then dried at 50° C. for 5 minutes and baked in an open-air atmosphere at 230° C. for 15 minutes, thereby forming a 30 nm uniform thin-film on the ITO substrate. A 25 mm×25 mm×0.7 mm (t) glass substrate with indium-tin oxide (ITO) patterned on the surface thereof to a film thickness of 150 nm was used as the ITO substrate. Prior to use, impurities on the surface were removed with an $O_2$ plasma cleaning system (150 W, 30 seconds).

Next, using an evaporation system (degree of vacuum, $1.0 \times 10^{-5}$ Pa), thin-films of N,N'-di(1-naphthyl)-N,N'-diphenylbenzidine (α-NPD), tris(8-quinolinolate)aluminum(III) ($Alq_3$), lithium fluoride and aluminum were successively deposited on the ITO substrate on which a thin-film had been formed, thereby giving an organic EL device. Evaporation was carried out at a rate of 0.2 nm/s for α-NPD, $Alq_3$ and aluminum, and at a rate of 0.02 nm/s for lithium fluoride. The film thicknesses were set to, respectively, 30 nm, 40 nm, 0.5 nm and 120 nm.

To prevent the device characteristics from deteriorating due to the influence of oxygen, moisture and the like in air, the organic EL device was sealed with sealing substrates, after which the characteristics were evaluated. Sealing was carried out by the following procedure.

The organic EL device was placed between sealing substrates in a nitrogen atmosphere having an oxygen concentration of 2 ppm or less and a dew point of not more than −85° C., and the sealing substrates were laminated together using an adhesive (XNR5516Z-B1, from Nagase ChemteX Corporation). A desiccant (HD-071010W-40, from Dynic Corporation) was placed, together with the organic EL device, within the sealing substrates at this time. The laminated sealing substrates were irradiated with UV light (wavelength, 365 nm; dosage, 6,000 mJ/cm²), then annealed at 80° C. for 1 hour to cure the adhesive.

Examples 2-2 and 2-3

Aside from using the varnishes obtained in Examples 1-2 and 1-3 instead of the varnish obtained in Example 1-1, organic EL devices were fabricated by the same method as in Example 2-1.

Example 2-4

Aside from setting the baking temperature to 180° C., an organic EL device was fabricated by the same method as in Example 2-1.

Examples 2-5 and 2-6

Aside from setting the baking temperature to 160° C., organic EL devices were fabricated by the same methods as in, respectively, Examples 2-1 and 2-2.

Examples 2-7 and 2-8

Aside from using the varnishes obtained in Examples 1-4 and 1-5 instead of the varnish obtained in Example 1-1 and setting the baking temperature to 150° C., organic EL devices were fabricated by the same method as in Example 2-1.

Comparative Example 3

Aside from forming a uniform 30-nm thin-film composed solely of N,N'-diphenylbenzidine on an ITO substrate by evaporation using N,N'-diphenylbenzidine as the evaporation source (evaporation rate, 0.2 nm/s) instead of forming a thin-film using a varnish, an organic EL device was fabricated by the same method as in Example 2-1.

The current densities and brightnesses of the organic EL devices fabricated were measured at a driving voltage of 5 V. The results are shown in Table 1.

TABLE 1

| | Baking temperature (° C.) | WD/WH (wt/wt) | Current density (mA/cm²) | Brightness (cd/m²) |
| --- | --- | --- | --- | --- |
| Example 2-1 | 230 | 4 | 74 | 1,818 |
| Example 2-2 | 230 | 5 | 74 | 1,935 |
| Example 2-3 | 230 | 6 | 74 | 1,983 |
| Example 2-4 | 180 | 4 | 78 | 2,249 |
| Example 2-5 | 160 | 4 | 85 | 2,324 |
| Example 2-6 | 160 | 5 | 94 | 2,649 |
| Example 2-7 | 150 | 5 | 45 | 1,432 |
| Example 2-8 | 150 | 6 | 54 | 1,866 |
| Comparative Example 3 | — | — | 0.002 | 0.022 |

As shown in Table 1, when charge-transporting thin-films obtained from charge-transporting varnishes according to the invention were used as the hole injection layer, it was possible to obtain organic EL devices having better brightness characteristics than when a vapor-deposited film composed of N,N'-diphenylbenzidine was used.

The invention claimed is:

1. A charge-transporting varnish comprising a charge-transporting material consisting of an N,N'-diarylbenzidine derivative of formula (1), a charge-accepting dopant consisting of a heteropolyacid, and a solvent consisting of at least one organic solvent:

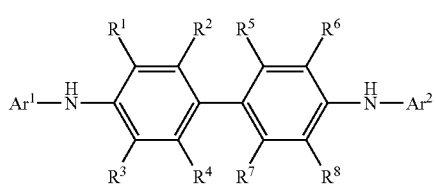

wherein $R^1$ to $R^8$ are each independently a hydrogen atom, a halogen atom, an alkyl group of 1 to 20 carbons, an alkenyl group of 2 to 20 carbons or an alkynyl group of 2 to 20 carbons; and $Ar^1$ and $Ar^2$ are each independently a group of formula (2) or (3):

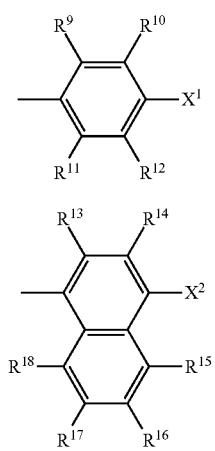

wherein $R^9$ to $R^{18}$ are each independently a hydrogen atom, a halogen atom, an alkyl group of 1 to 20 carbons, an alkenyl group of 2 to 20 carbons or an alkynyl group of 2 to 20 carbons; and $X^1$ and $X^2$ are each independently a hydrogen atom, a halogen atom, an alkyl group of 1 to 20 carbons, an alkenyl group of 2 to 20 carbons, an alkynyl group of 1 to 20 carbons, a diphenylamino group, a 1-naphthylphenylamino group, a 2-naphthylphenylamino group, a di(1-naphthyl)amino group, a di(2-naphthyl)amino group or a 1-naphthyl-2-naphthylamino group.

2. The charge-transporting varnish according to claim 1, wherein $R^1$ to $R^8$ are hydrogen atoms, fluorine atoms or alkyl groups of 1 to 20 carbons.

3. The charge-transporting varnish according to claim 1 or 2, wherein $R^9$ to $R^{18}$ are hydrogen atoms, fluorine atoms or alkyl groups of 1 to 20 carbons.

4. A charge-transporting thin-film produced using the charge-transporting varnish of claim 1.

5. An electronic device comprising the charge-transporting thin-film of claim 4.

6. An organic electroluminescence device comprising the charge-transporting thin-film of claim 4.

7. The organic electroluminescence device according to claim 6, wherein the charge-transporting thin-film is a hole injection layer or a hole transport layer.

8. The charge-transporting varnish according to claim 1, wherein the organic solvent comprises (i) a high-solvency solvent selected from the group consisting of N,N-dimethylformamide, N,N-dimethylacetamide, N-methylpyrrolidone, 1,3-dimethyl-2-imidazolidinone, diethylene glycol monomethyl ether, and mixtures thereof, and optionally comprises (ii) a high-viscosity organic solvent selected from the group consisting of cyclohexanol, ethylene glycol, ethylene glycol diglycidyl ether, 1,3 octylene glycol, diethylene glycol, dipropylene glycol, triethylene glycol, tripropylene glycol, 1,3-butanediol, 2,3 butanediol, 1,4-butanediol, propylene glycol, hexylene glycol, and mixtures thereof and/or (iii) a solvent selected from the group consisting of ethylene glycol monobutyl ether, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether, propylene glycol monomethyl ether acetate, diethylene glycol monoethyl ether, diacetone alcohol, γ-butyrolactone, ethyl lactate, n-hexyl acetate, and mixtures thereof.

* * * * *